United States Patent
Jo et al.

(10) Patent No.: US 10,505,477 B2
(45) Date of Patent: Dec. 10, 2019

(54) LOAD DRIVE CURRENT CONTROL METHOD AND SYSTEM

(71) Applicant: LG Chem, Ltd., Seoul (KR)

(72) Inventors: Yong Min Jo, Daejeon (KR); Ju Young Sun, Cheonan-si (KR)

(73) Assignee: LG Chem, Ltd. (KR)

( * ) Notice: Subject to any disclaimer, the term of this patent is extended or adjusted under 35 U.S.C. 154(b) by 49 days.

(21) Appl. No.: 15/799,526

(22) Filed: Oct. 31, 2017

(65) Prior Publication Data

US 2018/0123491 A1    May 3, 2018

(30) Foreign Application Priority Data

Nov. 2, 2016    (KR) .................. 10-2016-0145083

(51) Int. Cl.
| | |
|---|---|
| H02P 1/00 | (2006.01) |
| H02P 7/29 | (2016.01) |
| G01R 31/382 | (2019.01) |
| H01M 10/44 | (2006.01) |
| H02J 7/00 | (2006.01) |
| G01R 31/44 | (2006.01) |
| H01M 10/48 | (2006.01) |

(52) U.S. Cl.
CPC .............. *H02P 7/29* (2013.01); *G01R 31/382* (2019.01); *G01R 31/44* (2013.01); *H01M 10/44* (2013.01); *H01M 10/446* (2013.01); *H01M 10/48* (2013.01); *H02J 7/007* (2013.01); *H02J 7/0063* (2013.01)

(58) Field of Classification Search
CPC .... H02P 7/29; G01R 31/3606; H01M 10/446; H02J 7/007
USPC ......................................................... 318/139
See application file for complete search history.

(56) References Cited

U.S. PATENT DOCUMENTS

| | | | |
|---|---|---|---|
| 2007/0058404 A1* | 3/2007 | Yaguchi ................. | H02M 1/36 363/132 |
| 2011/0261589 A1* | 10/2011 | Goto ................. | H02M 3/33592 363/15 |
| 2016/0315479 A1* | 10/2016 | Ide ........................ | H02M 3/158 |

FOREIGN PATENT DOCUMENTS

| | | |
|---|---|---|
| JP | 2015216776 A | 12/2015 |
| KR | 2016-114408 A | 10/2016 |

* cited by examiner

*Primary Examiner* — Bickey Dhakal
*Assistant Examiner* — Gabriel Agared
(74) *Attorney, Agent, or Firm* — Lerner, David, Littenberg, Krumholz & Mentlik, LLP

(57) ABSTRACT

The present disclosure relates to a battery load drive system, and more particularly, to a battery load drive system for preparing for a surge current generated by a capacitor when a battery is coupled to a battery using a path for reducing current additionally provided in an existing path.

11 Claims, 4 Drawing Sheets

LOAD DRIVE CURRENT CONTROL METHOD AND SYSTEM

CROSS-REFERENCE TO RELATED APPLICATION

This application claims priority to Korean Patent Application No. 10-2016-0145083 filed on Nov. 2, 2016 and all the benefits accruing therefrom under 35 U.S.C. § 119, the contents of which are incorporated by reference in their entirety.

BACKGROUND

The present disclosure relates to a battery load drive system, and more particularly, to a battery load drive system for preparing for a surge current generated by a capacitor when a battery is coupled to a battery using a path for reducing current additionally provided in an existing path.

Generally, a device (load) using a motor receives electrical energy to couple with a charged battery and converts the charged electrical energy of the coupled battery into a mechanical energy through the motor in the load.

However, the high-frequency current is induced in an electric wire by the switch (relay, IGBT, FET, etc.) of the power semiconductor, and this high frequency current causes the battery to overload and generate noise in the electric wire.

As a solution to this problem, a capacitor is mounted in the load to prevent the high frequency switching current from being discharged to the outside.

Although the capacitors differ depending on the power used, a high capacity is usually used to reduce the ripple current generated during the drive.

However, when the capacitor is directly coupled to the battery without a separate circuit, a surge (inrush) current is momentarily generated in the device (load).

The surge current has a large current value as the capacity of the capacitor increases. If such a surge current flows through the circuit, there is a risk that the life of the capacitor is reduced due to the large current and the peripheral device is destroyed so that a fire is generated.

A conventional technique for preventing such surge current generation will be described in detail with reference to FIG. 1.

FIG. 1 is a circuit diagram of a conventional surge current generation prevention circuit.

Referring to FIG. 1, conventionally, a second path having a precharge resistance is formed separately in addition to a first path for supplying a current from a battery to a load, so that when the battery is coupled to the load, by allowing the current flowing from the battery through the second path to flow in the precharge resistor to reduce the current.

However, such a method has a large resistance depending on the amount of current, and a large resistance takes up a lot of space.

Also, since the required capacitor size is different according to each load, it is difficult to apply various resistance values.

Therefore, in order to improve the reliability of the product due to the safe drive and to be applicable to the various loads, it is necessary to provide various sizes of currents to prevent the surge current generated when the battery is coupled to the load.

PRIOR ART DOCUMENTS

Patent Documents (Patent Document 1) KR10-2016-0114408 A

SUMMARY

The present disclosure provides a load drive current control method and system that can prevent a large surge current from flowing into the system when a battery is coupled to various loads by supplying a variety of currents, and can reliably drive the load to improve the reliability of the product.

In accordance with an exemplary embodiment, a method of controlling a drive current supplied to a load by using a battery includes: an initial Pulse Width Modulation (PWM) signal output operation for outputting an initial PWM signal having a predetermined initial duty ratio as a switching control signal of a switch for turning on/off a current flow between the load and the battery to supply a current to the load; and a voltage measurement operation for measuring a load voltage of the load where the current is supplied according to the initial PWM signal outputted from the initial PWM signal output operation and a battery voltage of the battery; a voltage difference calculation operation for calculating a difference between the battery voltage and the load voltage measured in the voltage measurement operation; a switch on operation for turning on the switch when the difference between the battery voltage and the load voltage measured in the voltage measurement operation is less than a predetermined reference value; and a correction PWM signal output operation for increasing a duty ratio or a period of the initial PWM signal to output the increased one as an on/off control signal of the switch when the difference between the battery voltage and the load voltage measured in the voltage measurement operation is greater than the predetermined reference value.

When the correction PWM signal is outputted from the correction PWM signal output operation, until the difference between the battery voltage and the load voltage becomes less than the predetermined reference value, by performing the voltage measurement operation, the operation except for the initial PWM signal output operation may be repeated.

The predetermined initial duty ratio of the initial PWM signal may be determined by a size of a capacitance of a capacitor included in the load.

The current supplied to the load by the initial PWM signal may charge the capacitor included in the load.

The duty ratio or the period of the PWM signal increased in the correction PWM signal output operation may be increased gradually.

In accordance with another exemplary embodiment, a system for controlling a drive current supplied to a load by using a battery includes: a battery configured to be a current source; a control unit configured to output a PWM signal having a predetermined duty ratio according to a voltage difference between the battery and the load; and a discharge switching unit configured to turn on/off a current flowing from the battery to the load based on the duty ratio of the PWM signal outputted from the control unit.

The load may include a capacitor.

The control unit may include: a voltage measurement unit configured to measure a voltage of the battery and the load; a voltage difference calculation unit configured to calculate a difference between the battery voltage of the battery and the load voltage of the load measured in the voltage measurement operation; a voltage determination unit configured to determine whether the voltage difference calculated in the voltage difference calculation unit is less than a predetermined reference value; and a PWM signal output unit configured to output a correction PWM signal by increasing a duty ratio or a period of a previously-outputted PWM signal when the voltage difference determination unit determines that the voltage difference is greater than the predetermined reference value.

The PWM signal output unit may output an initial PWM signal having a predetermined initial duty ratio at the first execution.

The predetermined initial duty ratio of the initial PWM signal may be determined by a size of a capacitance of a capacitor included in the load.

A current supplied to the load by the initial PWM signal may charge the capacitor included in the load.

The duty ratio or the period of the previously-outputted PWM signal may be increased gradually.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
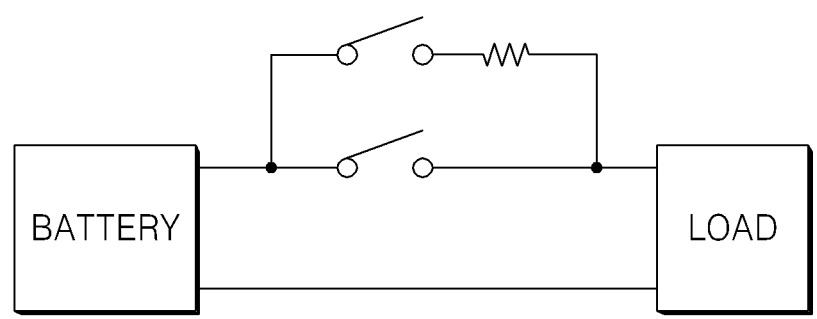
FIG. 1 is a circuit diagram of a conventional surge current generation prevention circuit.

Hereinafter, embodiments of the present disclosure will be described in detail with reference to the accompanying drawings so that those skilled in the art can easily carry out the present disclosure. The present disclosure may, however, be embodied in different forms and should not be construed as limited to the embodiments set forth herein. Parts not relating to description are omitted in the drawings in order to clearly describe the present disclosure and like reference numerals refer to like elements throughout.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

Although the terms "first," "second," etc., may be used herein to describe various elements, these elements should not be limited by these terms. The above terms are used only to distinguish one component from another. For example, a first component may be referred to as a second component and vice versa without departing from the scope of the present disclosure. Terms used in this specification are used to describe specific embodiments, and are not intended to limit the scope of the present disclosure. The singular expressions include plural expressions unless the context clearly dictates otherwise.

Terms used in this specification may be currently widely used general terms in consideration of functions in the present disclosure but may vary according to the intents of those skilled in the art, precedents, or the advent of new technology. Additionally, in certain cases, there may be terms the applicant selects arbitrarily and in this case, their meanings are described in a corresponding description part of the present disclosure. Accordingly, terms used in the present disclosure should be defined based on the meaning of the term and the entire contents of the present disclosure instead of the simple term name <Embodiment 1>

Next, a load drive current control method according to an embodiment of the present disclosure will be described.

In the present disclosure, the load drive current control method uses the PWM signal to supply the battery current to the load, measures the voltage difference between the battery and the load, and increases the duty ratio and period of the PWM signal based on the measured voltage difference, thereby controlling the current of the battery supplied to the load.

Figure 2:
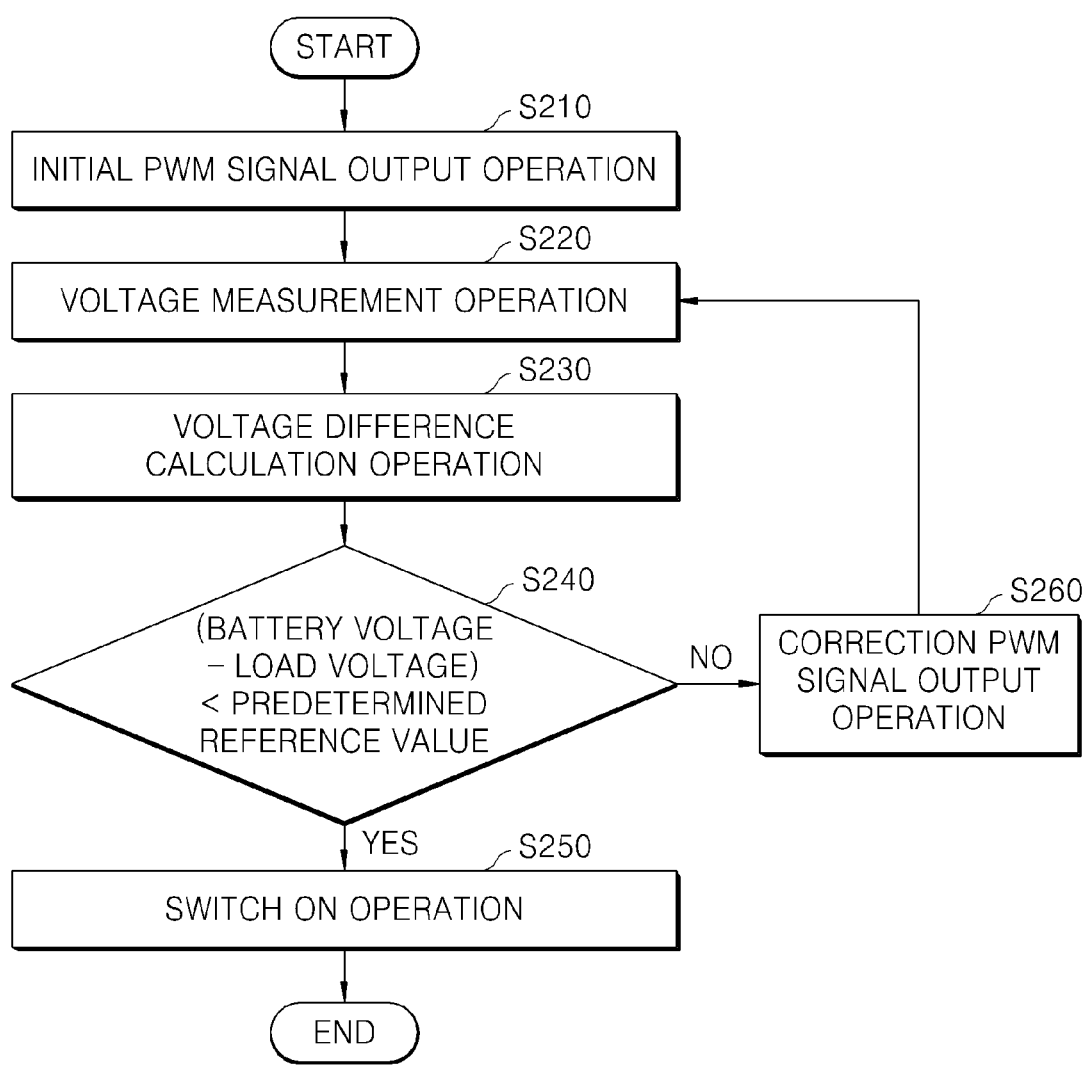
FIG. 2 is a flowchart of a load drive current control method according to an embodiment of present disclosure.

FIG. 2 is a flowchart of a load drive current control method according to an embodiment of present disclosure.

Referring to FIG. 2, a method of controlling a drive current supplied to a load using a battery according to an embodiment of present disclosure first outputs a switching control signal of a switch for turning on/off the current flow between the load having a predetermined initial duty ratio and the battery to supply the current to the load (initial PWM signal output operation: S210) and measures the load voltage of the load where the current is supplied and the battery voltage of the battery according to the outputted initial PWM signal (voltage measurement operation: S220).

In addition, when the difference between the measured battery voltage and load voltage is calculated (voltage difference calculation operation: S230) and the difference between the calculated battery voltage and load voltage is less than a predetermined reference value (S240), the switch is turned on to allow the entire current of the battery to be loaded (switch on operation: S250).

If the difference between the calculated battery voltage and load voltage is equal to or greater than the predetermined reference value (S240), the duty ratio or period of the initial PWM signal is increased to output the ON/OFF control signal of the switch (correction PWM signal output operation: S260).

When the correction PWM signal is outputted, the voltage measurement operation (S220) is performed to repeat the operation except the initial PWM signal output operation (S210) until the difference between the battery voltage and the load voltage becomes less than the predetermined reference value.

The load drive current control method is described in more detail below.

The predetermined initial duty ratio of the initial PWM signal is determined by the size of the capacitance of the capacitor included in the load because the size of the surge current is determined in proportion to the capacitance of the capacitor.

Here, the surge current refers to a current instantaneously generated in an electric/electronic device that is a load when a battery is directly connected to various electric/electronic devices without a separate circuit, and typically has a large current value that can damage peripheral devices.

In addition, the predetermined initial duty ratio is set by separately storing the duty ratio value according to the capacitance of the capacitor and fetching the stored value when the load is coupled with the battery. If the same load is used, a proper duty ratio value according to the capacitance of the capacitor is set in advance.

In general, the initial duty ratio according to the load connected to the battery is set to 5% as one embodiment.

In addition, the current supplied to the load by the initial PWM signal first charges the capacitor included in the load to prevent a surge current from being generated.

In addition, the current reduction due to the PWM signal output will be described in more detail with reference to FIG. 3.

Figure 3:
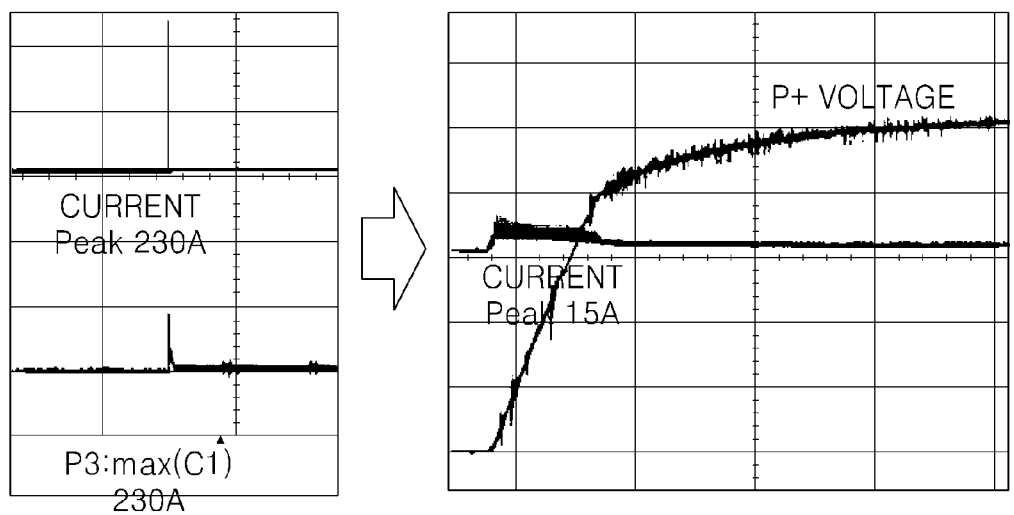
FIG. 3 is a graph during a load drive current control according to an embodiment of present disclosure.

FIG. 3 is a graph during a load drive current control according to an embodiment of present disclosure.

Referring to FIG. 3, when a battery having 230 A outputs a PWM signal having a proper duty ratio to a switch in a path that supplies current to a load, the current supplied to the load is reduced to 15 A. This reduced current is supplied to the load, so that it gradually increases the voltage of the load.

After the initial PWM signal is outputted in the initial PWM signal output operation S210 or the correction PWM signal is outputted in the correction PWM signal output operation S260, the voltage measurement operation S220 is performed after a predetermined time elapses.

Here, if the predetermined time is set too fast, since the size of the current may be rapidly increased and a surge current may be generated, the predetermined time is not set too fast. If the predetermined time is set too slow, the current will slowly increase and the load will be slowed down. Therefore, the predetermined time can be set to a proper time according to the capacity of each battery and the capacitor in the load.

Also, the voltage difference calculation operation (S230) calculates a voltage difference using the voltage measured in the voltage measurement operation (S220), and this calculates a determination value for determining whether to control to increase the current supplied to the load by increasing the duty ratio or period outputted in advance according to the voltage difference or turn on a switch to supply the entire current of the battery to the load.

Here, the voltage difference calculation method uses a method of subtracting the load voltage from the battery voltage.

Also, the voltage difference is compared to a predetermined reference value, and the predetermined reference value is set to 5V as an embodiment, but is not limited thereto.

Therefore, when the value obtained by subtracting the load voltage from the battery voltage is less than the predetermined reference value, the voltage difference between the battery and the load is not large so that the PWM signal output is stopped and the switch is turned on to allow the entire current of the battery to flow to the load.

This method has an advantage that a complicated algorithm that outputs a PWM signal and sets the duty ratio to the switch that receives the output PWM signal can be switched simply by switching on.

However, in this method, since the configuration of the PWM control unit for setting the duty ratio of the switch is unnecessary except when the battery is coupled to the load, it is possible to supply the entire current of the battery to the load through another method.

In another embodiment, when the value obtained by subtracting the load voltage from the battery voltage is less than a predetermined reference value, a method of setting the duty ratio of the PWM signal to 100% and outputting it may be performed.

With such a method, in the case that the duty ratio is 100% if the percentage value obtained by dividing the entire period in the ON-time is higher as the switch-ON time is longer, it is like the switch is ON always.

Accordingly, the current is limited by outputting the PWM signal according to a discharge function, so that the use time of the battery can be increased.

If the value obtained by subtracting the load voltage from the battery voltage is equal to or greater than the predetermined reference value, since a limited current is required for the load, the current is slightly increased to be supplied to the load.

Herein, in order to increase the current, the duty ratio of the PWM signal must be increased or the period must be increased. In one embodiment, the duty ratio is increased by 1%, and the period is set to be increased by 1 ms but the present disclosure is not limited thereto.

Such a duty ratio or period increase is progressively made. For example, if the duty ratio starts at 5% and the voltage difference between the battery and the load does not reach a predetermined reference value, the duty ratio is increased from 5% to 6%, and if the voltage difference between the battery and the load does not reach the predetermined reference value, the duty ratio is increased by 1% through a method of increasing the duty ratio from 6% to 7%.

Likewise for the period, if the period starts at 10 ms and the voltage difference between the battery and the load does not reach a predetermined reference value, the period is increased from 10 ms to 11 ms, and if the voltage difference between the battery and the load does not reach the predetermined reference value, the period is increased by 1 ms through a method of increasing the period from 11 ms to 12 ms.

Such an increase is increased to 95% in one embodiment. If there is a voltage difference large enough to generate a surge current between the battery and the load due to insufficient current supply, this limits the current value not to allow the total current to be supplied.

In addition, if the voltage difference between the battery and the load does not reach a predetermined reference value on an algorithm, the PWM duty ratio or period must be increased. Therefore, the PWM duty ratio or period of the minimum unit that can be increased from the PWM duty ratio of 95% or more is increased.

<Embodiment 2>

Next, a load drive current control system according to an embodiment of the present disclosure will be described.

The load drive current control system of the present disclosure reduces the current supplied to the load through the PWM signal when the battery is coupled to the load, thereby charging the capacitor in the load and allowing the load to be driven safely.

Figure 4:
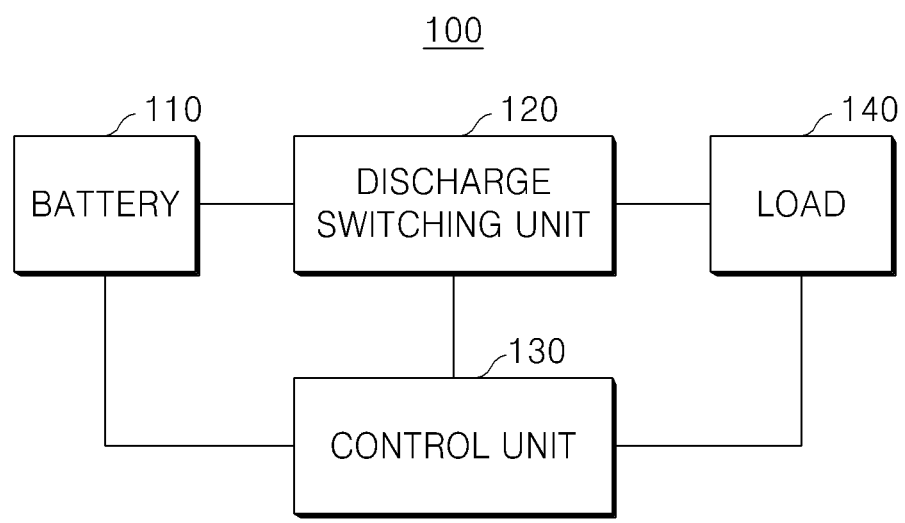
FIG. 4 is a schematic block diagram of a load drive current control system according to an embodiment of present disclosure.

FIG. 4 is a schematic block diagram of a load drive current control system according to an embodiment of present disclosure.

Referring to FIG. 4, a battery load drive system 100 according to an embodiment of present disclosure includes a battery 110 as a current source, a control unit 130 for outputting a PWM signal having a predetermined duty ratio according to a voltage difference between the battery and the load, a discharge switching unit 120 for turning on/off the current flowing from the battery 110 to a load based on the duty ratio of the PWM signal outputted from the control unit 130, and a load 140 driven by the current of the battery 110. Here, the battery 110 is a battery pack configured with a plurality of battery cells and may be charged using an external power source. In addition, the load 140 includes a capacitor.

More specifically, the discharge switching unit 120 includes a discharge switch (not shown) for controlling ON/OFF of the current and a duty ratio control unit (not shown) for controlling the duty ratio of the discharge switch (not shown). A duty ratio control unit (not shown) receives the PWM signal outputted from the control unit 120 and sets the duty ratio of the discharge switch (not shown) to match the duty ratio in the PWM signal.

Here, the discharge switch (not shown) may include a relay, an IGBT or an FET device.

The control unit 130 for controlling the discharge switching unit 120 will be described in detail below with reference to FIG. 5.

Figure 5:
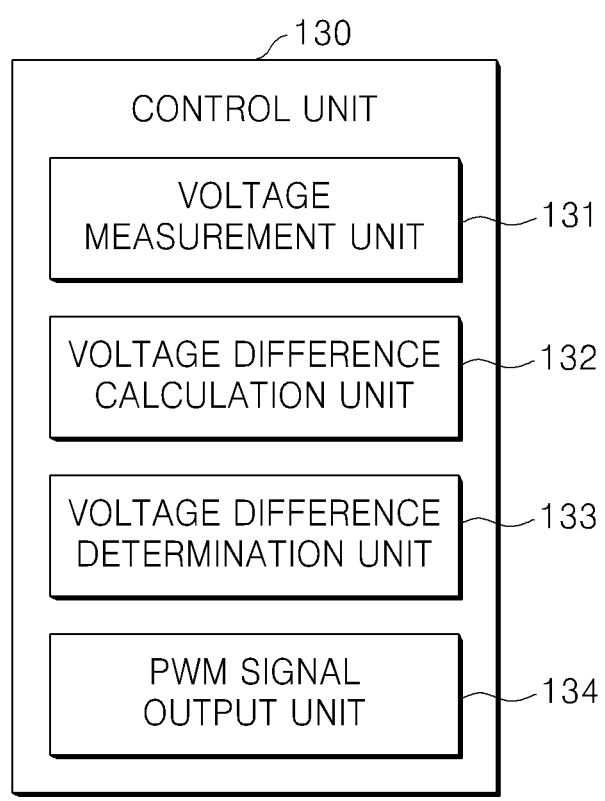
FIG. 5 is a schematic block diagram of a control unit in a load drive current control system according to an embodiment of present disclosure.

FIG. 5 is a schematic block diagram of a control unit in a load drive current control system according to an embodiment of present disclosure.

Referring to FIG. 5, the control unit 130 included in the BMS (not shown) includes a voltage measurement unit 131 for measuring a voltage of the battery 110 and the load 140 when a battery is coupled to a load, a voltage difference calculation unit 132 for calculating a difference between the battery voltage of the battery and the load voltage of the load measured in the voltage measurement unit 131, a voltage difference determination unit 133 for determining whether the voltage difference calculated in the voltage difference calculation unit 132 is less than a predetermined reference value, and a PWM signal output unit 134 for outputting a correction PWM signal by increasing a duty ratio or a period of the PWM signal outputted in advance when the voltage difference determination unit 133 determines that the voltage difference is equal to or greater than the predetermined reference value.

Here, the calculation method of the voltage difference calculation unit 132 uses a method of subtracting the voltage of the load 140 from the voltage of the battery 110.

In addition, the PWM signal output unit 134 outputs an initial PWM signal having a predetermined initial duty ratio when the battery 110 is coupled to the load 140 to first perform a load drive current control.

In addition, the predetermined initial duty ratio of the initial PWM signal is determined by the size of the capacitance of the capacitor included in the load 140 because the size of the surge current is determined in proportion to the capacitance of the capacitor.

Here, the surge current refers to a current instantaneously generated in an electric/electronic device that is the load 140 when the battery 110 is directly connected to various electric/electronic devices without a separate circuit, and typically has a large current value that can damage peripheral devices.

In addition, the initial duty ratio is set by separately storing the duty ratio value according to the capacitance of the capacitor and fetching the stored value when the load 140 is coupled with the battery 110. If the same load 140 is used, a proper duty ratio value according to the capacitance of the capacitor is set in advance.

Here, the initial duty ratio according to the load 140 connected to the battery 110 is set to 5% as one embodiment.

In addition, the current supplied to the load 140 by the initial PWM signal first charges the capacitor included in the load to prevent a surge current from being generated.

The load drive current control system 100 outputs an initial PWM signal having a predetermined initial duty ratio through the PWM signal output unit 134, thereby preventing generation of a surge current when the battery 110 is coupled to the load 140.

The outputted initial PWM duty ratio signal sets the duty ratio of the switch according to the duty ratio of the PWM signal received at the discharge switching unit 120.

A current provided according to the duty ratio of the initial PWM signal is supplied to the load 140 and a voltage of the battery 110 and the load 140 is measured through the voltage measurement unit 131 after a predetermined time.

In addition, the voltage difference calculation unit 132 calculates a voltage difference between the battery 110 and the load 140 using the measured voltage.

The calculated voltage difference is compared to a predetermined reference value through the voltage difference determination unit 133. When the voltage difference between the battery 110 and the load 140 is less than the predetermined reference value, the control unit 130 stops the output of the PWM signal of the PWM signal output unit 134 and stops the duty ratio control for setting the duty ratio to the discharge switch of the duty ratio control unit (not shown). Also, the discharge switch (not shown) of the discharge switching unit 120 is turned on.

If the voltage difference between the battery 110 and the load 140 is greater than or equal to a predetermined reference value, the PWM signal output unit 134 outputs a correction PWM duty ratio signal of a duty ratio that is one step higher than a predetermined initial duty ratio of an initial PWM signal.

Here, the predetermined time may be measured using a timer included in the control unit 130.

In addition, the predetermined initial duty ratio is stored in a memory (not shown).

The load drive current control method and system according to an embodiment of the disclosure control a discharge current using a PWM signal, thereby preventing a surge current from being generated in various loads and driving a load safely.

Although the load drive current control method and system have been described with reference to the specific embodiments, they are not limited thereto. Therefore, it will be readily understood by those skilled in the art that various modifications and changes can be made thereto without departing from the spirit and scope of the present disclosure defined by the appended claims.

What is claimed is:

1. A method of controlling a drive current supplied to a load when the load is connected to a battery, the method comprising:

outputting an initial PWM signal having a predetermined initial duty ratio and an initial period, wherein the initial PWM signal is an initial switching control signal of a switch for turning on/off an initial current flow between the load and the battery to supply an initial current to the load; and measuring a load voltage of the load while the initial current is supplied to the load;

measuring a battery voltage of the battery;

calculating a difference between the measured battery voltage and the load voltage measured while the initial current is supplied to the load;

if the difference between the measured battery voltage and the load voltage measured while the initial current is supplied to the load is less than a predetermined reference value, continue outputting PWM signals at the initial duty ratio; and if the difference between the measured battery voltage and the load voltage measured while the initial current is supplied to the load is greater than the predetermined reference value, outputting subsequent PWM signals at either: a duty ratio that is greater than the initial duty ratio, or a period that is longer than the initial period.

2. The method of claim 1, further comprising:
repeatedly:
measuring the load voltage of the load;
measuring the battery voltage of the battery;
calculating the difference between the measured battery voltage and the load voltage measured; and
outputting the subsequent PWM signal,
until the difference between the measured battery voltage and the measured load voltage becomes less than the predetermined reference value.

3. The method of claim 1, wherein the predetermined initial duty ratio of the initial PWM signal is determined by a size of a capacitance of a capacitor included in the load.

4. The method of claim 3, wherein the initial current supplied to the load by the initial PWM signal charges the capacitor included in the load.

5. The method of claim 2, wherein the duty ratio or the period of the subsequent PWM signal is increased gradually if the difference between the repeatedly measured battery voltage and the repeatedly measured load voltage remains greater than the predetermined reference value.

6. A system for controlling a drive current supplied to a load when the load is connected to a battery, the system comprising:
a battery configured to be a current source;
a control unit comprising a PWM signal output unit configured to output an initial PWM signal having an initial predetermined duty ratio;
a discharge switching unit comprising a switch configured to turn on/off a current flowing from the battery to the load based on the duty ratio of the PWM signal outputted from the control unit;
a voltage measurement unit configured to measure:
a voltage of the battery; and
a voltage of the load from an initial current supplied to the load by the initial PWM signal;
a voltage difference calculation unit configured to calculate a difference between the measured voltage of the battery and the measured voltage of the load; and
a voltage determination unit configured to determine whether the voltage difference calculated in the voltage difference calculation unit is less than a predetermined reference value,
wherein:
if the voltage difference is greater than the predetermined reference value, the PWM signal output unit is configured to output a correction PWM signal by increasing either the initial duty ratio or the initial period; and
if the voltage difference is less than the predetermined reference value, the PWM signal output unit is configured to continue outputting PWM signals at the initial duty ratio and the initial period.

7. The system of claim 6, wherein the load comprises a capacitor.

8. The system of claim 6, wherein the PWM signal output unit is configured to output an initial PWM signal having a predetermined initial duty ratio at a first execution.

9. The system of claim 8, wherein the predetermined initial duty ratio of the initial PWM signal is preset based on a size of a capacitance of a capacitor included in the load.

10. The system of claim 9, wherein the initial current supplied to the load by the initial PWM signal charges the capacitor included in the load.

11. The system of claim 6, wherein if the voltage difference remains greater than the predetermined reference value, the PWM signal output unit is configured to increase the one of the duty ratio and the period of the previously-outputted PWM signal gradually.

* * * * *